(12) United States Patent
He et al.

(10) Patent No.: US 11,282,569 B2
(45) Date of Patent: Mar. 22, 2022

(54) APPARATUS WITH LATCH BALANCING MECHANISM AND METHODS FOR OPERATING THE SAME

(71) Applicant: Micron Technology, Inc., Boise, ID (US)

(72) Inventors: Yuan He, Boise, ID (US); Hiroshi Akamatsu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/774,932

(22) Filed: Jan. 28, 2020

(65) Prior Publication Data

US 2021/0233581 A1 Jul. 29, 2021

(51) Int. Cl.
*G11C 7/10* (2006.01)
*G11C 11/4096* (2006.01)
*G11C 11/4074* (2006.01)
*G11C 17/16* (2006.01)
*G11C 11/4093* (2006.01)

(52) U.S. Cl.
CPC .......... *G11C 11/4096* (2013.01); *G11C 7/106* (2013.01); *G11C 7/1087* (2013.01); *G11C 11/4074* (2013.01); *G11C 11/4093* (2013.01); *G11C 17/16* (2013.01)

(58) Field of Classification Search
CPC . G11C 11/4096; G11C 7/106; G11C 11/4074; G11C 11/4093; G11C 16/16
See application file for complete search history.

(56) References Cited

U.S. PATENT DOCUMENTS

| 6,038,191 A * | 3/2000 | Fukuhara | G11C 7/1045 257/E27.097 |
| 7,388,420 B2 * | 6/2008 | Diorio | G11C 7/20 327/208 |
| 10,916,327 B1 * | 2/2021 | He | G11C 29/50 |
| 2005/0013178 A1 * | 1/2005 | Suzuki | G11C 11/4076 365/194 |
| 2008/0159042 A1 * | 7/2008 | Bertin | G11C 17/18 365/225.7 |

* cited by examiner

*Primary Examiner* — Tuan T Nguyen
(74) *Attorney, Agent, or Firm* — Perkins Coie LLP

(57) ABSTRACT

Methods, apparatuses, and systems related to a memory device are described. The memory device may include local latching circuits each having a retention circuit and a driving circuit. The retention circuit may be configured to provide local storage of broadcasted information for a down-stream circuit. The driving circuit may be configured to connect a first voltage and a second voltage to the retention circuit at different times across the broadcast and the local storage.

20 Claims, 9 Drawing Sheets

APPARATUS WITH LATCH BALANCING MECHANISM AND METHODS FOR OPERATING THE SAME

TECHNICAL FIELD

The disclosed embodiments relate to devices, and, in particular, to semiconductor memory devices with latch balancing mechanisms and methods for operating the same.

BACKGROUND

An apparatus (e.g., a processor, a memory system, and/or other electronic apparatus) can include one or more semiconductor circuits configured to store and/or process information. For example, the apparatus can include a memory device, such as a volatile memory device, a non-volatile memory device, or a combination device. Memory devices, such as dynamic random-access memory (DRAM), utilize electro-magnetic energy to store and access data.

Technological improvements are often associated with decreasing the physical size of the apparatus and/or circuits therein. However, decreasing the physical size often present new or additional challenges. For example, some memory devices include predetermined information (e.g., failure/repair information, device identifier, etc.) stored in non-volatile memory (e.g., fuses) and broadcasted to circuits/portions within the memory devices following designated events like power-on or power-reset events. Various circuits/portions within the memory devices include a set of fuse latches configured to locally load and/or store the broadcasted information. While reducing the size/footprint of each latch may be desirable, such reductions lower a drive capacity for loading to and/or accessing from the information relative to the latch. Accordingly, the amount of charge needed to change the state (e.g., latched voltage levels) of the latch is reduced, which leads to increase in data errors (e.g., soft error rates (SER) caused by the changes in the latched data.

DETAILED DESCRIPTION

Figure 1:
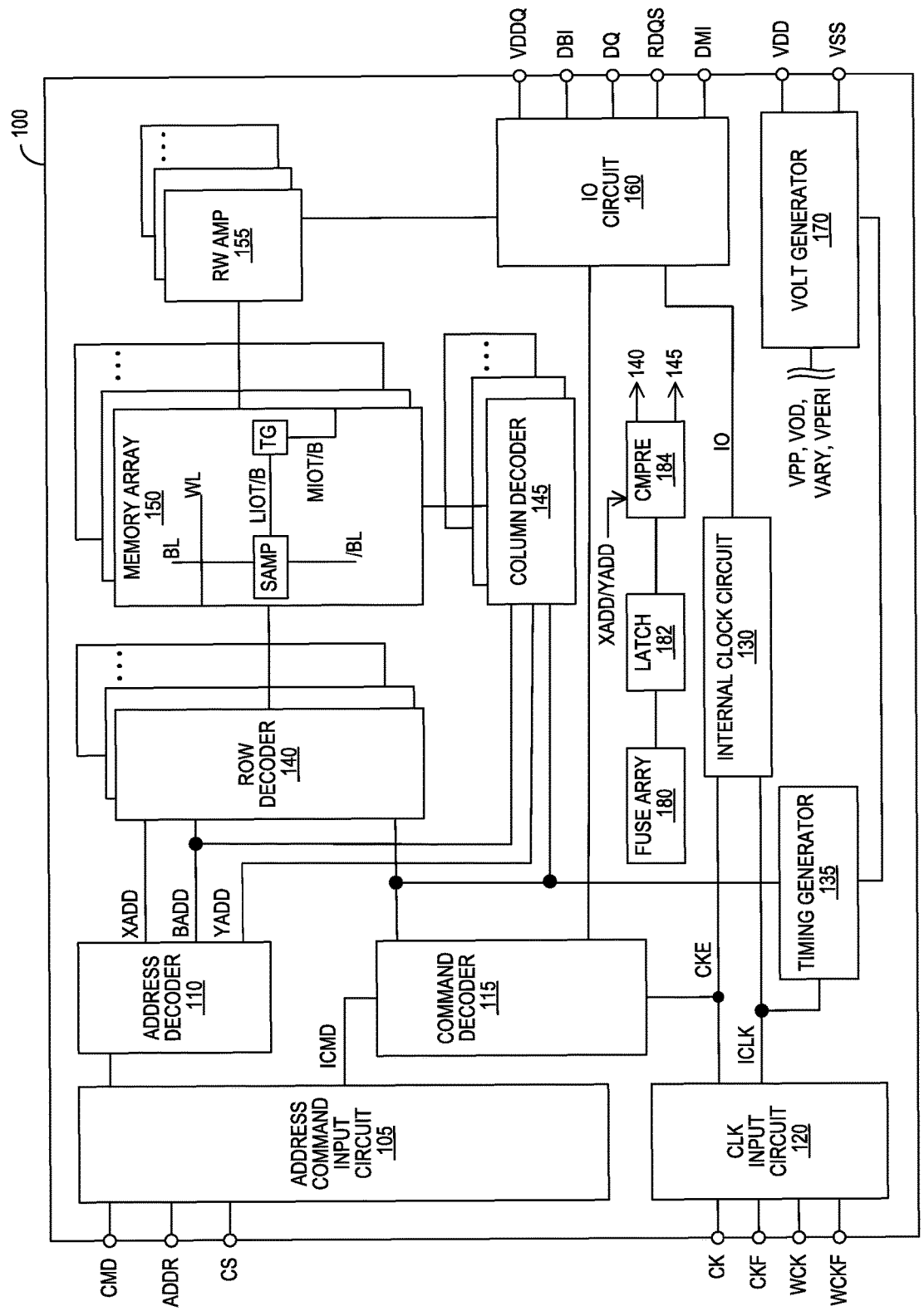
FIG. 1 is a block diagram of an apparatus in accordance with an embodiment of the present technology.

As described in greater detail below, the technology disclosed herein relates to an apparatus, such as for memory systems, systems with memory devices, related methods, etc., for locally latching received data. The apparatus (e.g., a memory device and/or a system including the memory device) can include latch circuits configured to locally store received or communicated data.

Fuse latch circuits are often associated with soft errors that contribute to uncorrectable error correction code (UECC) errors that correspond to failure in time (FIT) measures. The soft errors associated with the fuse latch circuits may be caused by insufficient drive capacity (e.g., ability to load and/or access the data into/from the latches) and/or unintended changes in the latch states due to external influence (e.g., neutron strikes on transistors and/or row-hammer effects). Accordingly, the FIT measures may be directly proportionate to an N+ area associated with transistor sizes and/or inversely proportionate to critical charge (Qcrit) associated with the latch. The critical charge can be a measure of drive capacity that corresponds to an amount of charge needed to change the state of the fuse latches. In other words, larger transistors in the fuse latch circuits may be more likely to receive neutron strikes while smaller transistors may have less drive capacity.

As described in detail below, the apparatus may include latch circuits with balancing mechanisms configured to improve the ratio between the N+ area and Qcrit measure. In some embodiments, a balancing mechanism may include a driving circuit configured to control a biasing voltage for one or more transistors within a storage portion. The driving circuit can set the biasing voltage to a first level to latch a bit, float the biasing voltage initially after latching the bit, and/or set the biasing voltage to a second level that is greater than the first level. Accordingly, by floating the biasing voltage and/or driving the biasing voltage to the second level, the driving circuit can improve the critical charge of the latch circuit without increasing the N+ area. The increased critical charge can lead to reduced error rates.

Additionally or alternatively, the balancing mechanism may include a mirrored latch configuration that connects a first latch and a second latch in a mirrored configuration. One of the connected latches may be an unused latch that has been reconfigured via the mirrored latch configuration. Accordingly, the previously unused latch can latch the same information as the mirrored latch, which can effectively increase the N+ area. For accessing the information, the mirrored latch configuration can include an output selection circuit that selects the latch output from the main latch and not the output from the previously unused latch. Accordingly, the error possibility (e.g., area susceptible to neutron strikes) is limited to the main latch even with the increased N+ area.

Further additionally or alternatively, the balancing mechanism may include a split latch configuration that includes a first storage portion connected in parallel to a second storage portion. The first and second storage portions can each be implemented using half-size silicon footprints. Accordingly, the parallel connected first and second storage portions may combine to the same N+ area as a single storage portion in other embodiments. However, the first and second storage portions may be located at different locations. Accordingly, the first and second storage portions may reduce or errors that may result from a single neutron strike (e.g., at a single location), such as for the single/whole storage portion. In other words, the split latch configuration can preserve the N+ area while lowering the error rates by distributing the layout placement of the first and second storage portions. With the two halves, the split latch configuration can provide increased robustness as degradation caused by a neutron strike on one of the halves will likely not cause complete failure for the struck half. Accordingly, the remaining charges/state in the struck half and those of the retained half may be combined to recover the original state.

FIG. 1 is a block diagram of an apparatus 100 (e.g., a semiconductor die assembly, including a three-dimensional integration (3DI) device or a die-stacked package) in accordance with an embodiment of the present technology. For example, the apparatus 100 can include a DRAM or a portion thereof that includes one or more dies/chips.

The apparatus 100 may include an array of memory cells, such as memory array 150. The memory array 150 may include a plurality of banks (e.g., banks 0-15), and each bank may include a plurality of word-lines (WL), a plurality of bit lines (BL), and a plurality of memory cells arranged at intersections of the word-lines and the bit lines. Memory cells can include any one of a number of different memory media types, including capacitive, magnetoresistive, ferroelectric, phase change, or the like. The selection of a word-line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The sense amplifiers and transfer gates may be operated based on control signals from decoder circuitry, which may include the command decoder 115, the row decoders 140, the column decoders 145, any control circuitry of the memory array 150, or any combination thereof. The memory array 150 may also include plate lines and corresponding circuitry for managing their operation.

The apparatus 100 may employ a plurality of external terminals that include command and address terminals coupled to a command bus and an address bus to receive command signals (CMD) and address signals (ADDR), respectively. The apparatus 100 may further include a chip select terminal to receive a chip select signal (CS), clock terminals to receive clock signals CK and CKF, data clock terminals to receive data clock signals WCK and WCKF, data terminals DQ, RDQS, DBI, and DMI, power supply terminals VDD, VSS, and VDDQ.

The command terminals and address terminals may be supplied with an address signal and a bank address signal (not shown in FIG. 1) from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal and supply the bank address signal to both the row decoder 140 and the column decoder 145.

The command and address terminals may be supplied with command signals (CMD), address signals (ADDR), and chip select signals (CS), from a memory controller and/or a nefarious chipset. The command signals may represent various memory commands from the memory controller (e.g., including access commands, which can include read commands and write commands). The chip select signal may be used to select the apparatus 100 to respond to commands and addresses provided to the command and address terminals. When an active chip select signal is provided to the apparatus 100, the commands and addresses can be decoded, and memory operations can be performed. The command signals may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word-line and a column command signal to select a bit line. The command decoder 115 may further include one or more registers for tracking various counts or values (e.g., counts of refresh commands received by the apparatus 100 or self-refresh operations performed by the apparatus 100).

Read data can be read from memory cells in the memory array 150 designated by row address (e.g., address provided with an active command) and column address (e.g., address provided with the read). The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the apparatus 100, for example, in a mode register (not shown in FIG. 1). The read latency information RL can be defined in terms of clock cycles of the CK clock signal. For example, the read latency information RL can be a number of clock cycles of the CK signal after the read command is received by the apparatus 100 when the associated read data is provided.

Write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160 and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the apparatus 100, for example, in the mode register. The write latency WL information can be defined in terms of clock cycles of the CK clock signal. For example, the write latency information WL can be a number of clock cycles of the CK signal after the write command is received by the apparatus 100 when the associated write data is received.

The power supply terminals may be supplied with power supply potentials $V_{DD}$ and $V_{SS}$. These power supply potentials $V_{DD}$ and $V_{SS}$ can be supplied to an internal voltage generator circuit 170. The internal voltage generator circuit 170 can generate various internal potentials $V_{PP}$, $V_{OD}$, $V_{ARY}$, $V_{PERI}$, and the like based on the power supply potentials $V_{DD}$ and $V_{SS}$. The internal potential $V_{PP}$ can be used in the row decoder 140, the internal potentials $V_{OD}$ and $V_{ARY}$ can be used in the sense amplifiers included in the memory array 150, and the internal potential $V_{PERI}$ can be used in many other circuit blocks.

The power supply terminal may also be supplied with power supply potential $V_{DDQ}$. The power supply potential $V_{DDQ}$ can be supplied to the input/output circuit 160 together with the power supply potential VSS. The power supply potential $V_{DDQ}$ can be the same potential as the power supply potential $V_{SS}$ in an embodiment of the present technology. The power supply potential $V_{DDQ}$ can be a different potential from the power supply potential $V_{DD}$ in another embodiment of the present technology. However, the dedicated power supply potential $V_{DDQ}$ can be used for the input/output circuit 160 so that power supply noise generated by the input/output circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a clock/enable signal from the command decoder 115, an input buffer can receive the clock/enable signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable (not shown in FIG. 1) from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as timing signals for determining output timing of read data and/or input timing of write data. The IO clock signals can be provided at multiple clock frequencies so that data can be output from and input to the apparatus 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The apparatus 100 can be connected to any one of a number of electronic devices capable of utilizing memory for the temporary or persistent storage of information, or a component thereof. For example, a host device of apparatus 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to apparatus 100; although in other embodiments, the host device may be indirectly connected to memory device (e.g., over a networked connection or through intermediary devices).

In some embodiments, the apparatus 100 can include non-volatile memory, such as fuses or anti-fuses, configured to store predetermined information. For example, the non-volatile memory may be used to store failure/repair information, device or circuit identifiers, and/or other operational information necessary across power cycles. Such non-volatile memory may be grouped, such as for a fuse array 180, and may be at a location removed/remote from the devices or circuits that use the stored information. Accordingly, one or more of the circuits or devices described above may include local latches 182 configured to load and store the predetermined information at a closer and/or more accessible location. For illustrative purposes the local latches 182 are shown near the fuse array 180, but it is understood that the local latches 182 may be placed away from the fuse array 180 and closer to other circuits, such as a comparison circuit 184, the row decoder 140, the column decoder 145, etc. The predetermined information in the non-volatile memory (e.g., the fuse array 180) may be communicated or broadcasted at a designated time, such as after a power-on event, and the devices/circuits may load the broadcasted information or a corresponding portion thereof in the local latches 182 for local storage. The term "local" can represent proximity (e.g., within a threshold distance) between the latches and a down-stream circuit configured to access the information stored in the latches.

The comparison circuit 184 can process the information in the local latches 182. As an example, the local latches 182 can store repair information used to swap defective rows/columns with redundant rows/columns. The comparison circuit 184 can receive addresses (e.g., row and/or column addresses) associated with incoming commands (e.g., read and/or write commands). The comparison circuit 184 can compare the receive addresses to the latched addresses to detect when the incoming commands are associated with defective cells. Based on the detection, the comparison circuit 184 and the subsequent circuits (e.g., the row decoder 140 and/or the column decoder 145) can access redundant memory instead of the defective cells associated with the command.

As described in detail below, the local latches 182 can include a balancing mechanism configured to improve the N+ area and/or the Qcrit measure without negatively affecting the remaining drive capacity and/or neutron-strike target area, respectively. In some embodiments, the balancing mechanism may include a driving circuit configured to control a biasing voltage for one or more transistors within a storage portion. The balancing mechanism may adjust a biasing voltage of one or more devices (e.g., transistors) in the latch, thereby increasing the drive capacity without increasing the N+ area. Additionally or alternatively, the balancing mechanism may include a mirrored latch configuration with a coupling circuit that connects one or more unused/unassigned latches to used/assigned latches, thereby increasing the N+ area and the corresponding drive capacity. The mirrored latch configuration may include an output selection circuit that provides selects the output from the used/assigned latch, thereby eliminating/reducing effects of neutron strikes to the unused/unassigned latches. Further additionally or alternatively, the balancing mechanism may include a split latch configuration that includes a first storage portion separated from and connected in parallel to a second storage portion. A combined size/capacity of the two storage portions can combine to a single/whole latch, thereby retaining the drive capacity. However, by locating the two halves at different locations, the split latch configuration may reduce/eliminate negative effects caused by a single neutron strike.

Figure 2:
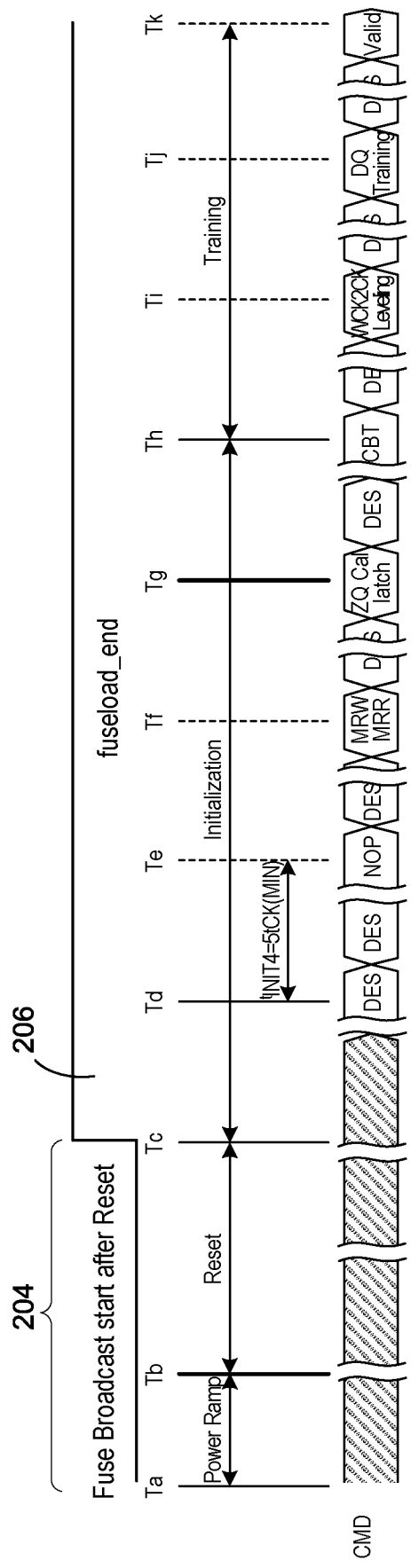
FIG. 2 is a timing diagram for a broadcast in accordance with an embodiment of the present technology.

FIG. 2 is a timing diagram for a broadcast in accordance with an embodiment of the present technology. In some embodiments, the apparatus 100 of FIG. 1 may store persistent data in non-volatile memory, such as fuses, anti-fuses, flash memory, and/or other persistent memory devices. The persistent data may include information necessary to boot and/or set the apparatus (e.g., the apparatus 100 of FIG. 1) for operation. Some examples of the stored persistent data may include device/circuit identifiers, repair information, and/or other apparatus setting data.

The non-volatile memory may be grouped, such as in fuse banks, and located in one or more locations separate from other circuits that access the stored persistent data. Accordingly, the apparatus 100 can communicate the stored persistent data from the grouped location(s), and the circuits that correspond to the communicated data can receive and locally latch the information.

As an illustrative example, the apparatus 100 can broadcast the stored persistent data from one or more fuse banks to a set of circuits illustrated in FIG. 1. One or more of the circuits illustrated in FIG. 1 may include local latches (e.g., volatile memory) configured to store a portion of the broadcasted information. In some embodiments, the broadcast may follow a power reset signal that indicates a system power to the apparatus 100 transition from an off-state to an on-state. The power reset signal may be issued between time Ta and time Tb.

The apparatus 100 may be configured to broadcast the information stored in the one or more fuse banks during a fuse broadcast phase 204. The fuse broadcast phase 204 can correspond to a duration following the power reset signal and end at time Tc. The apparatus 100 (via, e.g., a broadcast circuit) can read the data stored in the fuse array and broadcast the read data to one or more of the circuits illustrated in FIG. 1. Also, the one or more of the circuits can receive the broadcast data and load a corresponding portion into a local storage (e.g., local latch) according to the one or more of the commands.

After a predetermined duration, the fuse broadcast phase 204 may end and a fuse load end phase 206 may begin (e.g., at time Tc). The fuse load end phase 206 may correspond to a training phase or an initial calibration phase. During the fuse load end phase 206, the apparatus 100 may implement one or more predetermined processes to align timing signals, such as clock (CK) and/or data strobe (DQS), adjust read/write delays, and/or other setup processes. The apparatus 100 can implement such setup processes to establish an operational state.

Figure 3A:
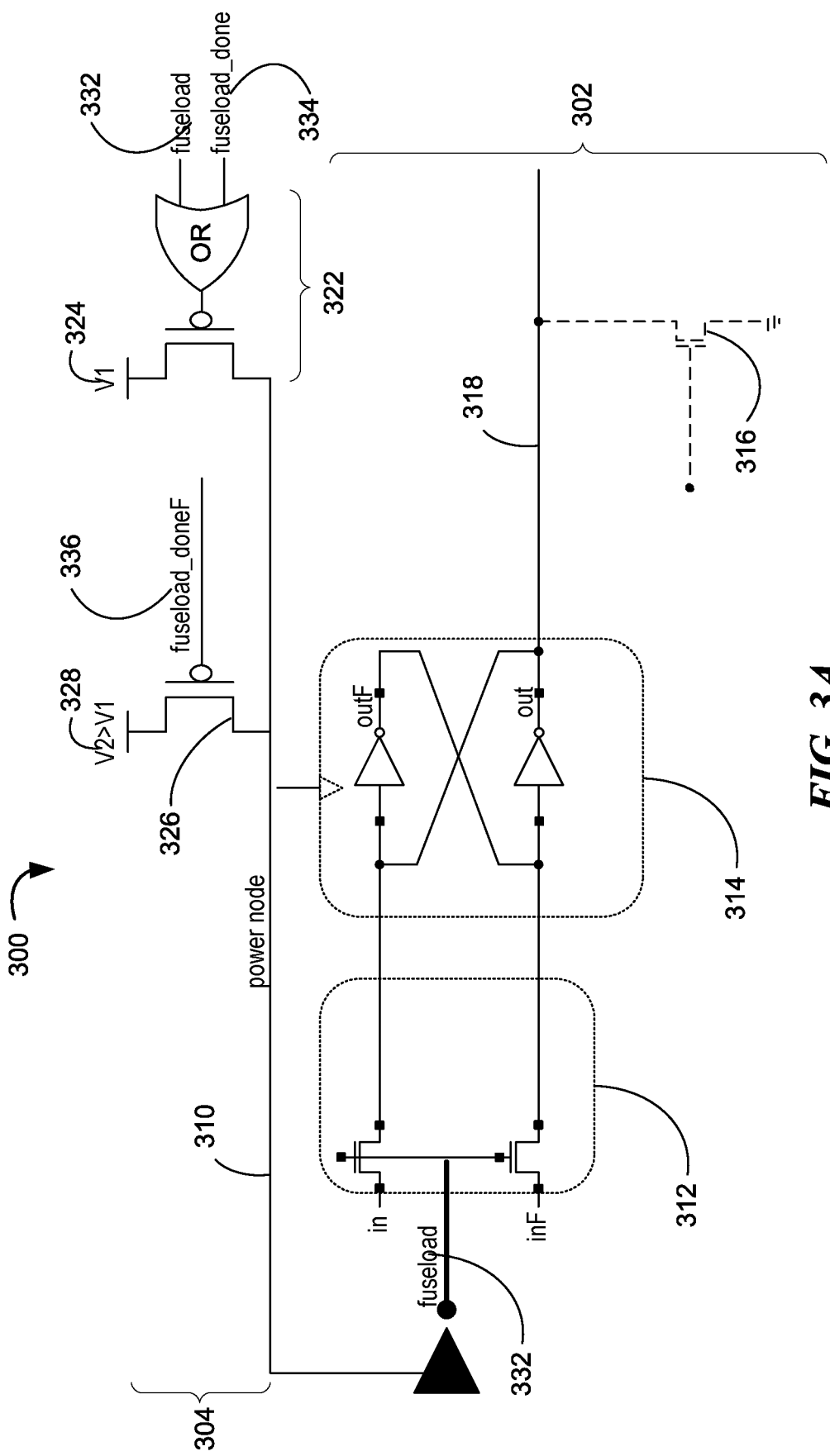
FIG. 3A is a schematic block diagram of a first example balancing mechanism in accordance with an embodiment of the present technology.

FIG. 3A is a schematic block diagram of a first example balancing mechanism in accordance with an embodiment of the present technology. As mentioned above, the apparatus 100 of FIG. 1 may broadcast information to one or more circuits illustrated in FIG. 1. Each of the one or more circuits may include a set of local latching circuits 300 configured to locally store the broadcast information or a portion thereof. As illustrated in FIG. 3A, each local latching circuit 300 may store one bit in a storage portion 302 (e.g., a static random-access memory (SRAM) circuit or a D latch (DLAT) circuit). The storage portion 302 may include a load circuit 312, a retention circuit 314, and/or a pull-down circuit 316. The load circuit 312 may include circuitry configured to receive and load broadcast information into the retention circuit 314. In some embodiments, the load circuit 312 may include transistors (e.g., NMOS devices) connected to the broadcast line on one side/terminal and to the retention circuit 314 on an opposite side/terminal. The load circuit 312 may be connected to (e.g., at gates thereof) and controlled by a corresponding fuse load signal 332. The fuse load signal 332 can be used to identify when relevant/targeted information for the local latching circuit 300 is broadcasted during the fuse broadcast phase 204 of FIG. 2. Accordingly, the fuse load signal 332 can operate the load circuit 312 to communicate the broadcast data at such timing to the retention circuit 314, thereby loading the relevant portion of the broadcast data.

The retention circuit 314 can include circuitry configured to store the loaded data and provide access thereto during operation of the apparatus 100. In other words, the retention circuit 314 may include volatile memory configured to store a locally relevant portion of the broadcast data. In some embodiments, the retention circuit 314 may include cross-coupled inverters. The cross-coupled inverters may include a first inverter and a second inverter. An input of the first inverter may be connected to a first load transistor and an output of the second inverter. An input of the second inverter may be connected to a second load transistor and an output of the first inverter. The output of the second inverter may be connected to an access node 318 where the latched data may be accessed or read.

In one or more embodiments, the local latching circuit 300 can include the pull-down circuit 316 (e.g., a transistor, such as an NMOS device) connected between the access node 318 and electrical ground. The pull-down circuit 316 can be configured to tie the access node 318 to ground and ensure a low state for certain conditions. In other embodiments, the local latching circuit 300 may be without the pull-down circuit 316. For example, the storage portion 302 may correspond to an SRAM circuit without the pull-down circuit 316.

To improve the Qcrit measure without negatively affecting the neutron-strike target area, the first example balancing mechanism can include a driving portion 304 coupled to the storage portion 302. The driving portion 304 can include circuitry configured to control an operating state of the retention circuit 314, such as by adjusting a biasing voltage for one or more transistors within the storage portion 302. Accordingly, the driving portion 304 can increase the drive capacity without changing the N+ area (e.g., footprint of the storage portion 302).

Figure 3B:
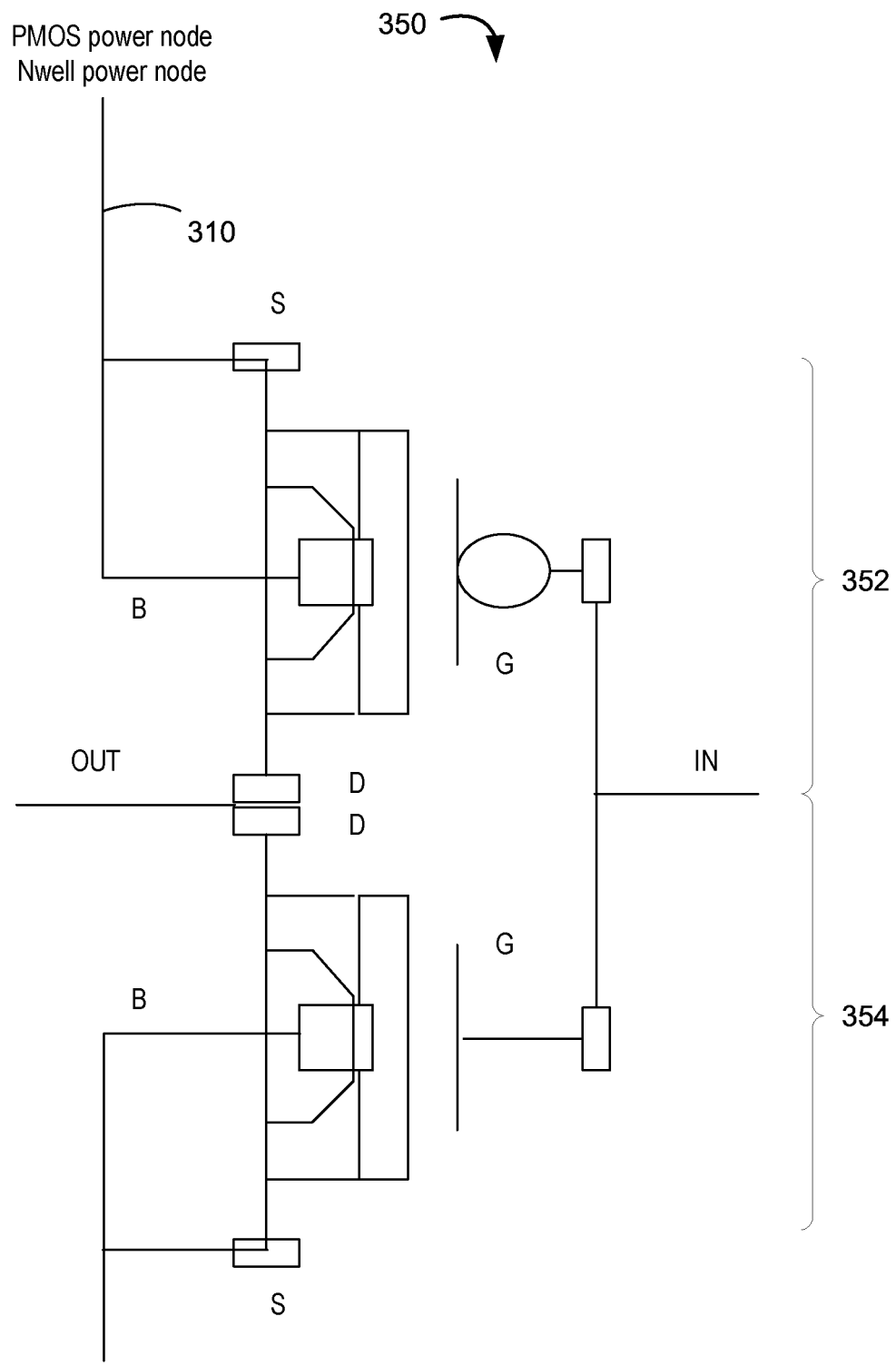
FIG. 3B is an example connection for a driving portion of the balancing mechanism in accordance with an embodiment of the present technology.

To illustrate the control of the operating state of the retention circuit 314, FIG. 3B is an example connection for a driving portion of the balancing mechanism in accordance with an embodiment of the present technology. Referring to FIGS. 3A and 3B together, the driving portion 304 can connect to the storage portion 302 at a power node 310, which is further connected to one or more of the inverters in the retention circuit 314 illustrated in FIG. 3B.

As an illustrative example, an inverter 350 (e.g., one of the inverters in the cross-coupled inverter circuit) may include a first switch 352 and a second switch 354. In some embodiments, the first switch 352 (e.g., a PMOS device) and the second switch 354 (e.g., an NMOS device) may be complementary transistors. The first switch 352 of the inverter 350 may be connected to the power node 310. For example, a source terminal and/or a body terminal of the first switch 352 may be directly connected to the power node 310. The input of the inverter 350 may be connected to the gates of the first and second switches 352 and 354, and the output of the inverter 350 may be connected between the first and second switches 352 and 354. For example, the respective drain terminals of the PMOS device and the NMOS device may be connected to the output of the inverter 350. The second switch may be connected (at, e.g., the source terminal) to a voltage potential (e.g., an electrical ground) different than that of the power node 310.

Referring back to FIG. 3A, the driving portion 304 may include a first voltage controller 322 and a second voltage controller 326 configured to provide power to the power node 310. The first voltage controller 322 can be configured to connect a first voltage source 324 to the power node 310. The first voltage controller 322 can be configured to connect the first voltage source 324 to the power node 310 during the fuse broadcast phase 204 except while loading the broadcast information. In some embodiments, the first voltage controller 322 may include a logic device (e.g., an OR device) that activates a transistor (e.g., a PMOS device) according to the fuse load signal 332 and a load-done signal 334 that identifies an end of the fuse broadcast phase 204. Accordingly, the first voltage controller 324 can connect the first voltage source 324 to the power node 310 (e.g., the OR device can activate the transistor) during the fuse broadcast phase 204 except when the fuse load signal 332 is active (e.g., while loading the broadcast information). In other words, the first voltage controller 324 can disconnect the first voltage source 324 from the power node 310 while loading the broadcast information (e.g., when the fuse load signal 332 is active) and also when the fuse broadcast phase 204 ends. For example, the OR device can activate the transistor before loading the incoming data (in/inF) and/or after loading the incoming data. The OR device can deactivate the transistor when loading the broadcast information and after the fuse broadcast phase 204 ends. As such, the first voltage controller 322 can provide high-impedance state for the retention circuit 314 during loading and provide increased voltage for the retention circuit after fuse broadcast, thereby improving the overall performance of the retention circuit 314.

The second voltage controller 326 can be configured to connect a second voltage source 328 to the power node 310. The second voltage source 328 can provide a second voltage level (V2) greater than a first voltage level (V1) of the first voltage source 324. The second voltage controller 326 can be configured to connect the second voltage source 328 to the power node 310 when the fuse broadcast phase 204 ends, thereby increasing the drive capacity (i.e., while maintaining the footprint of the retention circuit 314 and without increasing the N+ area) after loading the information and during operation. In some embodiments, the second voltage controller 326 can include a transistor (e.g., a PMOS device) connecting the second voltage source 328 to the power node 310 according to an inverted-done signal 336 (i.e., a complement of the load-done signal 334). Accordingly, the second voltage controller 326 can connect the second voltage source 328 to the power node 310 after the fuse broadcast phase 204.

In some embodiments, the driving portion 304 can be configured to set one or more devices (e.g., the inverters 350 in the retention circuit 314) to a third state during a loading phase. For example, when the fuse load signal 332 is active, the first voltage controller 322 and the second voltage controller 326 can both disconnect the respective power sources from the power node 310. Accordingly, the PMOS device in the inverters 350 within the retention circuit 314 can correspond to a float or a high impedance (HiZ) state. Thus, the driving portion 304 can improve a loading performance (e.g., loading time and/or efficiency) for the retention circuit 314 using the third state.

Figure 4:
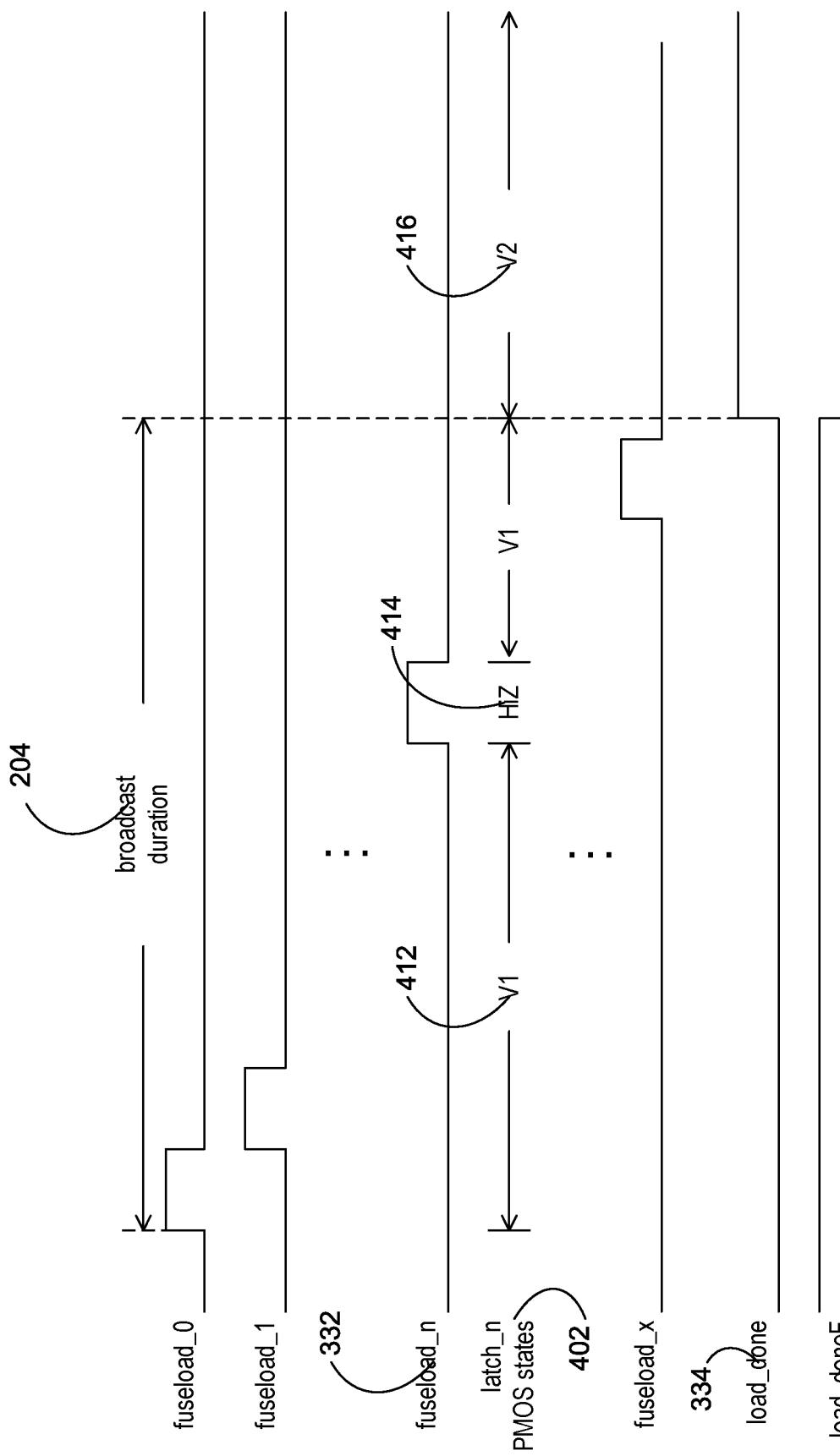
FIG. 4 is a timing diagram for the balancing mechanism in accordance with an embodiment of the present technology.

FIG. 4 is a timing diagram for the balancing mechanism (e.g., the local latching circuit 300 of FIG. 3) in accordance with an embodiment of the present technology. As described above, the apparatus 100 (via, e.g., the broadcasting circuit) can generate various fuse load signals (e.g., fuseload_0-fuseload_x) that are each configured to identify a loading phase for a corresponding local latching circuit. Following the power reset signal (e.g., between Ta and Tb of FIG. 2), the apparatus 100 can broadcast (via, e.g., corresponding circuit in the fuse array 180 of FIG. 1) the information stored in the fuse array 180. The apparatus 100 can broadcast the information according to a predetermined sequence, which are received at the latches 182 of FIG. 1. The latches 182 can load the broadcasted information based on a corresponding place/timing in the predetermined sequence. The apparatus 100 can communicate fuse load signals (e.g., enable signals) to the latches 182 that indicate the corresponding place/timing in the predetermined sequence. For a target latch n (e.g., an instance of the local latching circuit 300 among the latches 182), fuseload_n (e.g., the corresponding fuse load signal 332) can determine the loading phase contemporaneous with broadcast of the information corresponding to the target latch n.

The timing diagram illustrates an operation state 402, such as biasing state/voltage, for the inverter 350 of FIG. 3B in the corresponding retention circuit 314 of FIG. 3A. During an initial portion of the fuse broadcast phase 204, such as until the fuse load signal 332 is active, the operation state 402 can correspond to a first voltage 412 (V1) associated with the first voltage source 324 of FIG. 3A. During a loading phase for the target latch n and/or while the fuseload_n signal is active, the operation state 402 can correspond to a floating state 414 (HiZ). For the floating state 414, the power node 310 can be disconnected from both the first voltage source 324 and the second voltage source 328 of FIG. 3A. Accordingly, the first switch 352 of FIG. 3B can be isolated from a voltage source and/or in a high impedance state. The operation state 402 may return to the first voltage 412 after the floating state 414. When the fuse broadcast phase 204 ends, the operation state 402 can correspond to a second voltage 416 (V2) associated with the second voltage source 328 of FIG. 3A. The second voltage 416 can be greater than the first voltage 412. In other words, the second voltage controller 326 of FIG. 3A can connect the power node 310 to the second voltage source 328 when the load-done signal 334 becomes active and the inverted-done signal 336 becomes inactive.

Figure 5:
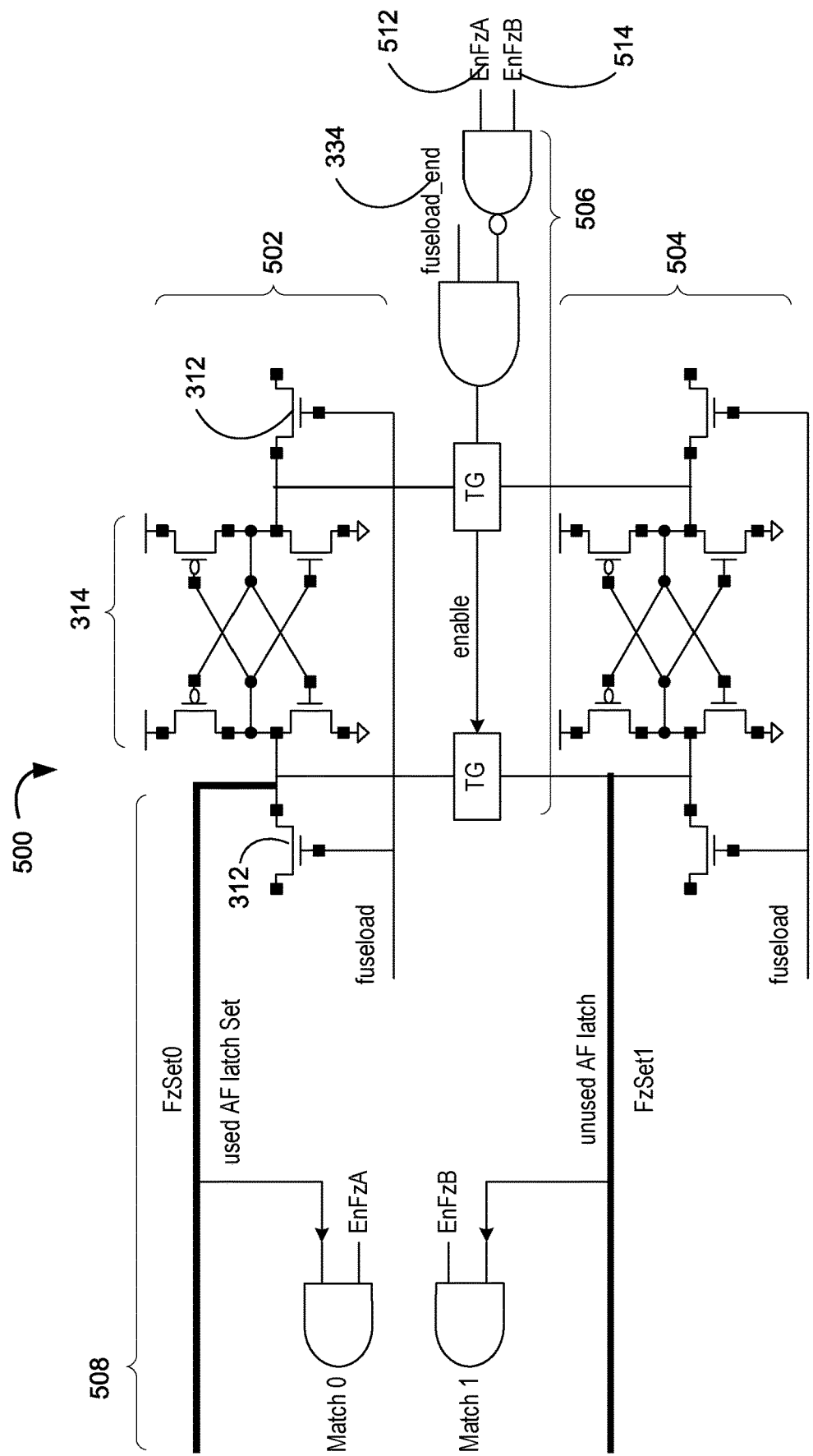
FIG. 5 is a schematic block diagram of a second example balancing mechanism in accordance with an embodiment of the present technology.

FIG. 5 is a schematic block diagram of a second example balancing mechanism in accordance with an embodiment of the present technology. The second example balancing mechanism can correspond to a mirrored latch configuration 500 that connects an active/used latch (e.g., a first latch 502) to an inactive/unused latch (a second latch 504). The apparatus 100 of FIG. 1 can be manufactured with a predetermined number of fuses and/or fuse latches that typically correspond to worst-case scenarios. As such, a portion of the fuses and/or latches are typically utilized, such as for repair information, during testing and qualification processes. As described in detail below, the mirrored latch configuration 500 can connect the active/used latches to inactive/unused latches to increase the drive capacity while limiting the latched information access to only the active/used latches to maintain the N+ area.

The first and second latches 502 and 504 may each correspond to the local latching circuit 300 of FIG. 3A or a portion thereof. For example, the first and second latches 502 and 504 may each include the retention circuit 314 connected to the load circuit 312. Also, the first and second latches 502 and 504 may each include the driving portion 304 of FIG. 3A. In other words, the second example balancing mechanism may be implemented in addition to or instead of the first example balancing mechanism.

The mirrored latch configuration 500 can include a coupling circuit 506 configured to connect a set of latches. The coupling circuit 506 may include a control portion and a connection portion. As an illustrative example, the control portion may include logic devices (e.g., a NAND device and an AND device), and the connection portion may include transmission gates (TGs) connected between the first and second latches 502 and 504. The control portion may operate the connection portion according to active/inactive states of the corresponding latches. For example, the control portion may receive a first enable 512 and a second enable 514 that respectively represent active/inactive states of the first and second latches 502 and 504. The control portion (via, e.g., the NAND device) may be configured to generate an active output when one latch is active and the other latch is inactive. The control portion may also receive the load-done signal 334 (e.g., at the AND device). The control portion may activate the connection portion and connect the first and second latches 502 and 504 when the load-done signal 334 is active and the active output indicates that one latch is active and the other latch is inactive. In other words, the coupling circuit 506 can connect the first and second latches 502 and 504 after the fuse broadcast phase 204 of FIG. 2 when only one of the set of latches have been activated. The unused latches can be connected in parallel to load and latch the same value, thereby increasing the drive capacity.

The mirrored latch configuration 500 can further include an output selection circuit 508 configured to selectively generate an access output (e.g., a read result of the latched information). The output selection circuit 508 may include logic devices (e.g., AND devices) configured to provide access to only the active latch without providing access to the inactive/coupled latch. As an illustrative example, the AND devices in the output selection circuit 508 can each receive one of the first and second enables 512, 514. The AND devices can generate corresponding match flags based on the first and second enables 512, 514, thereby accessing/utilizing the latched information from the active circuit without accessing/utilizing the latched information from the inactive circuit. While the drive capacity may be provided by a set of connected latches, the actual output corresponds to one circuit. Further, since the connected latches are separate, one neutron strike is less likely to affect the latched state of both latches in comparison to a single latch with larger (e.g., double) footprint. Thus, the mirrored latch configuration 500 can provide the increased drive capacity without increasing the error-susceptibility caused by increased N+area. The mirrored latch configuration 500 can further increase the robustness against changes in the latched states based on duplicating the latched states at two different locations.

Figure 6:
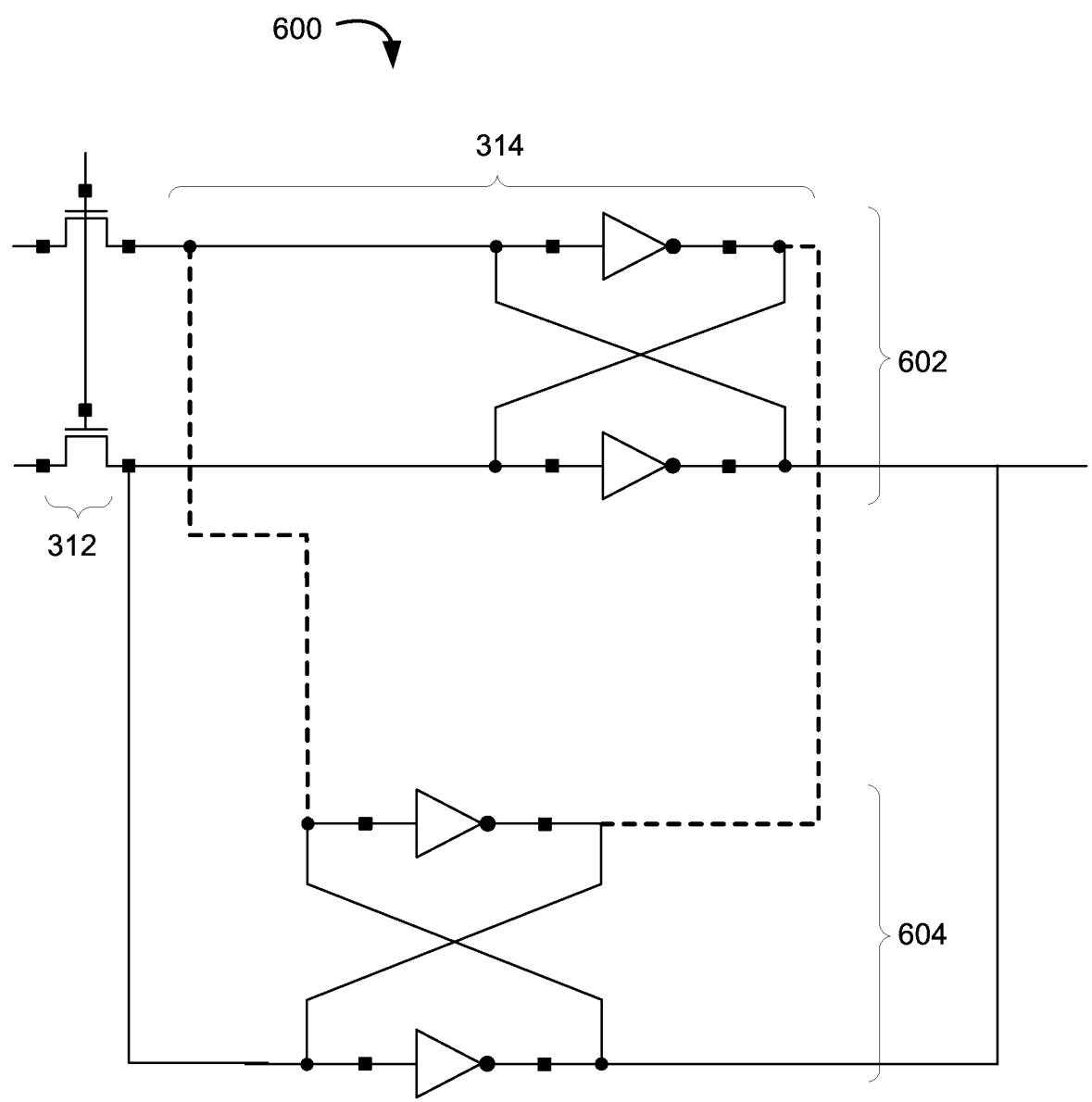
FIG. 6 is a schematic block diagram of a third example balancing mechanism in accordance with an embodiment of the present technology.

FIG. 6 is a schematic block diagram of a third example balancing mechanism in accordance with an embodiment of the present technology. The third example balancing mechanism can correspond to a split latch configuration 600 that includes separate fractional portions (e.g., a first storage portion 602 and a second storage portion 604) of the retention circuit 314 located at different locations in the apparatus 100 of FIG. 1.

The first and second storage portions 602 and 604 can have identical components and configurations but each with fractional sizes/capacities of the retention circuit 314. For example, the first storage portion 602 can include a set of cross-coupled inverters with a fractional (e.g., half) silicon foot-print connected to the load circuit 312. The second storage portion 604 can include a different set of cross-coupled inverters with a fractional (e.g., half) silicon foot-print connected to the load circuit 312 and connected parallel to the first storage portion 602. Accordingly, the combination of the storage portions can add up to the intended size/capacity of the load circuit 312, thereby preserving the drive capacity.

Since the retention circuit 314 is implemented by the separately located first and second storage portions 602 and 604, the latched states are preserved at two different locations. Accordingly, one neutron strike is less likely to affect the latched state of both portions in comparison to a single complete latch at one location. In other words, the split latch configuration 600 can preserve the N+ area but lower the SER. Thus, split latch configuration 600 can further increase the robustness against changes in the latched states based on duplicating the latched states at two different locations without reducing the drive capacity.

The first and second storage portions 602 and 604 may correspond to the local latching circuit 300 of FIG. 3A or a portion thereof. For example, the first and second storage portions 602 and 604 may be connected to the driving portion 304 of FIG. 3A. In other words, the third example balancing mechanism may be implemented in addition to or instead of the first example balancing mechanism. Further, the first and second storage portions 602 and 604 may be connected to a separate latch or a corresponding set of portions (via, e.g., the coupling circuit 506 and the output selection circuit 508 per the mirrored latch configuration 500 illustrated in FIG. 5). Thus, the third example balancing mechanism may be implemented in addition to or instead of the second example balancing mechanism.

Figure 7A:
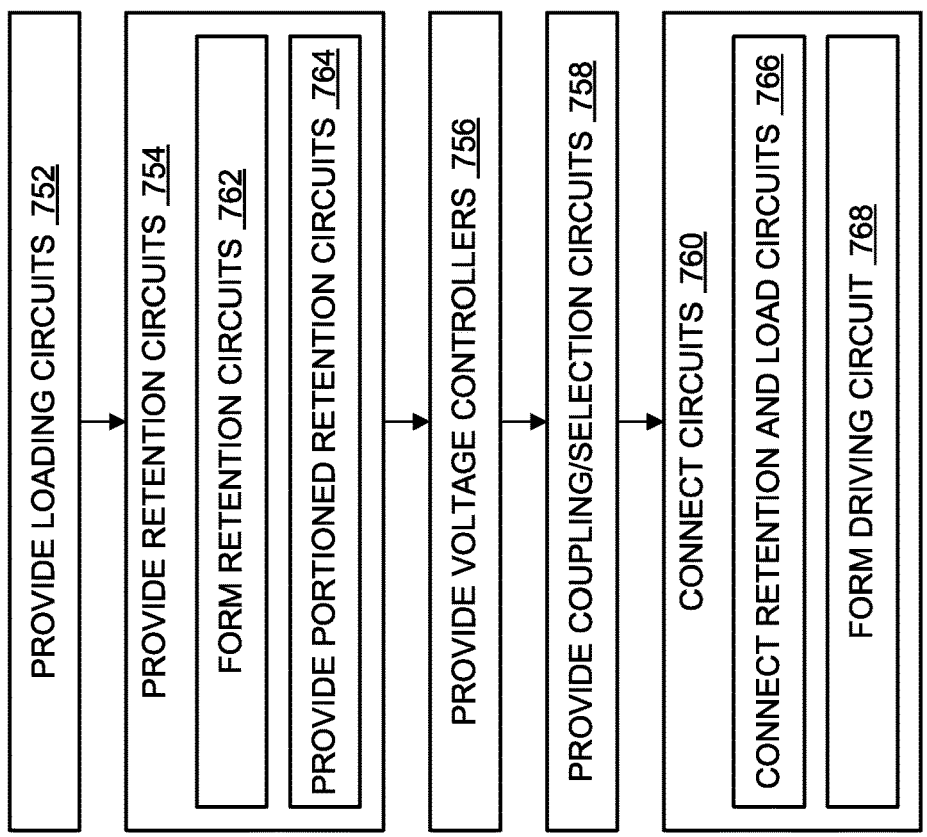
FIG. 7A is a flow diagram illustrating an example method of operating an apparatus in accordance with an embodiment of the present technology.

FIG. 7A is a flow diagram illustrating an example method 700 of operating an apparatus (e.g., the apparatus 100 of FIG. 1, the local latching circuits 300 of FIG. 3, the mirrored latch configuration 500 of FIG. 5, the split latch configuration 600 of FIG. 6, and/or a portion therein) in accordance with an embodiment of the present technology. For example, the method 700 can be for operating the local latching circuits 300 and/or the components therein. The method 700 can be for operating the apparatus 100 according to one or more of the balancing mechanisms described above.

At block 702, the apparatus 100 can detect a power reset condition. For example, the apparatus 100 (via, e.g., the voltage generator 170 of FIG. 1) can detect the power reset sequence 202 of FIG. 2, such as the power ramp condition and/or the reset condition.

At block 704, the apparatus 100 can broadcast persistent data to one or more circuits illustrated in FIG. 1. For example, the broadcast circuit can access persistent data stored in non-volatile memory (e.g., fuse bank). The broadcast circuit can communicate the accessed persistent data to the one or more circuits during the fuse broadcast phase 204 of FIG. 2. The accessed persistent data can be communicated to the load circuits 312 of FIG. 3A in the local latching circuits 300 of FIG. 3A for the corresponding one or more circuits.

At block 706, the apparatus 100 can connect the retention circuits 314 of FIG. 3A to the first voltage 412 of FIG. 4 (V1). For example, the apparatus 100 can control the fuse load signal 332 of FIG. 3A and the load-done signal 334 of FIG. 3A according to the broadcast sequence. The apparatus 100 can operate the first voltage controller 322 of FIG. 3A according to the fuse load signal 332 and the load-done signal 334 to connect the power node 310 of FIG. 3A to the first voltage source 324 of FIG. 3A. As described above, the apparatus 100 can connect the power node 310 and the connected first switch 352 of FIG. 3B (e.g., PMOS devices) to the first voltage 412. The retention circuits 314 can be connected to the first voltage 412 before and/or after corresponding loading phases and during the fuse broadcast phase 204.

At block 708, the apparatus 100 can locally store the broadcast data. As illustrated in FIG. 4, the local latching circuits 300 can sequentially receive and load the broadcast data during the fuse broadcast phase 204. Since the persistent data is broadcasted, the load circuits 312 can receive the broadcast data throughout the fuse broadcast phase 204. To load the broadcast data, the apparatus 100 can control the corresponding fuse load signals 332.

At block 712, the apparatus 100 can isolate the retention circuits 314 according to the corresponding fuse load signals 332. As described above, the driving portions 304 (e.g., the first and second voltage controllers 322 and 326) can remove the power node 310 from the first and second voltage sources 324 and 328 and the corresponding first and second voltages 412 and 416 based on the fuse load signals 332. Accordingly, the first switches 352 (e.g., PMOS devices) in the retention circuits 314 can be in the floating state 414 of FIG. 4 during the corresponding loading phase (e.g., while the loading circuits 312 are activated via the corresponding fuse load signals 332).

At block 714, the apparatus 100 can load the broadcast data according to the corresponding fuse load signals 332. In some embodiments, the apparatus 100 can load the broadcast data simultaneously with or after isolating the retention circuits 314. The load circuits 312 can load the targeted data based on transferring the broadcast data from the load circuits 312 to the connected retention circuits 314 according to the corresponding fuse load signals 332 and the loading phases.

At block 716, the apparatus 100 can load the broadcast data into split portions within each of the retention circuits 314. In some embodiments, the local latching circuits 300 can include the first and second storage portions 602 and 604 of FIG. 6. According to the split latch configuration 600 of FIG. 6, each of the retention circuits 314 can correspond to a targeted drive capacity. Each of the retention circuits 314 can include at least the first and second storage portions 602 and 604. The first and second storage portions 602 and 604 can be separate and located at different locations within the apparatus 100. The first and second storage portions 602 and 604 can correspond to a portion of the drive capacity. Based on the parallel connections between the first and second storage portions 602 and 604, the apparatus 100 can simultaneously load the broadcast data into the first and second storage portions 602 and 604.

The fuse broadcast phase 204 can end after a predetermined duration and/or after all broadcast data has been loaded into corresponding local latching circuits 300. The local latching circuits 300 can store the loaded broadcast data in the retention circuits 314 after the fuse broadcast phase 204, such as for latter access by down-stream circuits (e.g., one or more of the circuits illustrated in FIG. 1) during operation. The apparatus 100 can also control the load-done signal 334 and/or the inverted-done signal 336 of FIG. 3B according to the end of the fuse broadcast phase 204.

At block 710, the apparatus 100 can connect the retention circuits 314 to the second voltage 416 (V2). The apparatus 100 can operate the second voltage controller 326 according to the inverted-done signal 336 to connect the power node 310 to the second voltage source 328 of FIG. 3A. As described above, the apparatus 100 can connect the power node 310 and the connected first switch 352 (e.g., PMOS devices) to the second voltage 416. The retention circuits 314 can be connected to the second voltage 416 after the fuse broadcast phase 204.

In some embodiments, such as illustrated at block 712, the apparatus 100 may connect inactive latches to active latches. The apparatus 100 may include the coupling circuit 506 of FIG. 5 and the output selection circuit 508 of FIG. 5 connecting a set of local latching circuits 300 according to the mirrored latch configuration 500 of FIG. 5. The apparatus 100 can communicate enable signals (e.g., the first and second enables 512 and 514 of FIG. 5) according to whether the corresponding latches are active (e.g., an indication that the latch is selected to store the broadcast data for access during operation) or inactive/unused during operation. Based on the enable signals, the coupling circuit 506 can detect when one of the local latching circuits in the set is active and others are inactive. As a result of the detection, the coupling circuit 506 can connect in parallel the retention circuits 314 of the set of local latching circuits 300. The coupling circuit 506 can connect the retention circuits 314 after the fuse broadcast phase. Accordingly, the coupled/inactive retention circuits 314 can store the same charge levels (i.e., same/duplicate data) as the active latch.

Also based on the enable signals, the output selection circuit 508 can provide access to the retention circuit 314 of the active local latching circuit. The output selection circuit 508 can isolate or prevent access to the inactive retention circuits during operations. Accordingly, the apparatus 100 can use the inactive retention circuits to increase the drive capacity without increasing the failure rate.

Figure 7B:
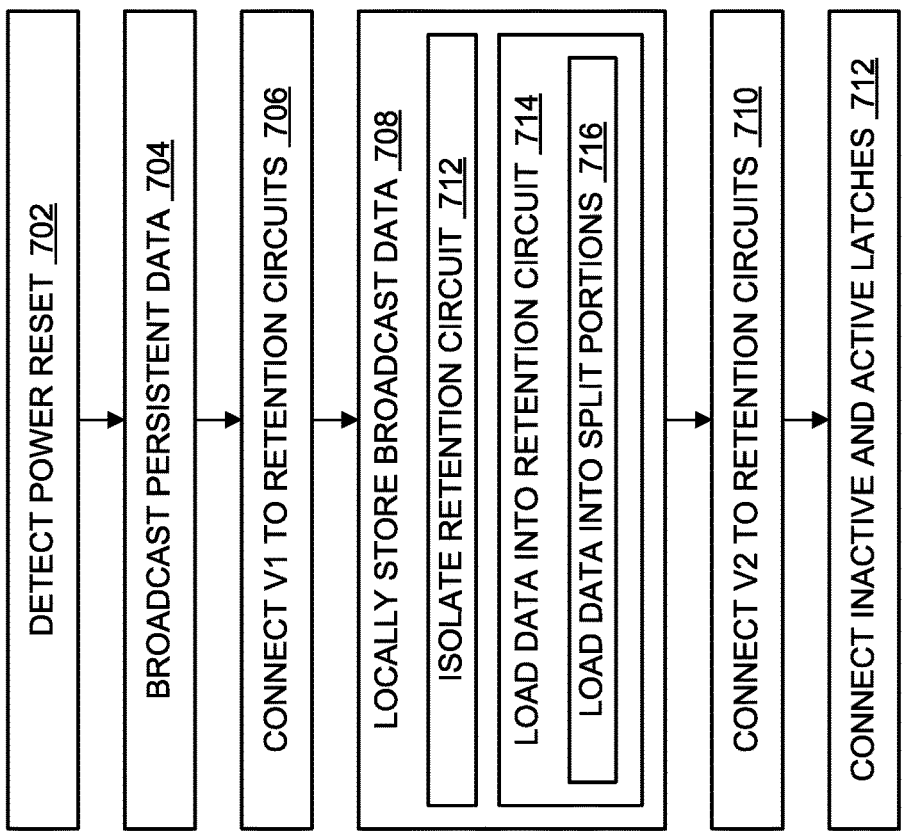
FIG. 7B is a flow diagram illustrating an example method of manufacturing an apparatus in accordance with an embodiment of the present technology.

FIG. 7B is a flow diagram illustrating an example method 750 of manufacturing an apparatus (e.g., the apparatus 100 of FIG. 1, the local latching circuits 300 of FIG. 3, the mirrored latch configuration 500 of FIG. 5, the split latch configuration 600 of FIG. 6, and/or a portion therein) in accordance with an embodiment of the present technology. For example, the method 750 can be for manufacturing the apparatus 100 including one or more of the balancing mechanisms described above.

At block 752, loading circuits (e.g., loading circuits 312 of FIG. 3A) may be provided. In some embodiments, providing the loading circuits may include forming the loading circuits (e.g., transistors, such as NMOS devices) on semiconductor material. The transistors may be formed based on depositing oxides, applying photoresists and/or masks, etching one or more layers, doping the semiconductor material, depositing/etching metal, and/or other semiconductor manufacturing processes.

At block 754, retention circuits (e.g., the retention circuits 314 of FIG. 3A) may be provided. As described above, the provided retention circuits may be configured to provide local storage of information for an accessing/down-stream circuit. In some embodiments, providing the retention circuits may include providing SRAM devices. In other embodiments, as illustrated at block 762, providing the retention circuits may include forming the retention circuits (e.g., cross-coupled inverters) on semiconductor material.

For example, forming the retention circuits may include forming sets of the first and second switches 352 and 354 of FIG. 3B according to semiconductor manufacturing processes as described above. In some embodiments, providing the retention circuits may include cross coupling the inverters, such as by connecting the inputs and outputs of the inverters as described above.

As illustrated at block 764, providing the retention circuits may include providing portioned retention circuits according to the split latch configuration 600 of FIG. 6. For example, providing/forming portioned retention circuits may include providing the first and second storage portions 602 and 604 of FIG. 6 at different locations for each implementation of the retention circuit 314. The retention circuit 314 can correspond to a targeted drive capacity, and the first and second storage portions 602 and 604 can correspond to fractions/portions of the targeted drive capacity. In some embodiments, providing the retention circuits may include connecting the first and second storage portions 602 and 604 in parallel.

At block 756, voltage controllers (e.g., the first and second voltage controllers 322 and 326 of FIG. 3A) for the driving portion 304 of FIG. 3A may be provided. Providing the voltage controllers may include providing switches, transistors, and/or logic devices. In some embodiments, providing the voltage controllers may include forming the transistors and/or logic devices on semiconductor material according to one or more semiconductor processes described above.

At block 758, coupling circuits (e.g., the coupling circuits 506 of FIG. 5) and output selection circuits (e.g., the output selection circuits 508 of FIG. 5) may be provided. For example, the coupling circuits 506 and the output selection circuits 508 may be provided or formed according to the mirrored latch configuration 500 of FIG. 5. In some embodiments, the coupling circuits 506 and the output selection circuits 508 can be provided between or coupled to predetermined sets of the local latching circuits 300. Providing the coupling circuits 506 and the output selection circuits 508 may include providing the transmission gates and/or the logic devices and/or forming them in semiconductor material.

At block 760, various circuits, such as the load circuit 312, the retention circuit 314, the storage portions, the voltage controllers, the coupling circuits 506, and/or the output selection circuits 508, may be connected. For example, connecting the circuits can include forming conductors (e.g., traces and/or metal layers), such as by masking, depositing metallic material, and/or etching processes. Accordingly, at block 766, the retention circuits and the load circuits can be electrically connected to each other. Also, at block 768, the driving circuit (e.g., the driving portion 304) may be formed. For example, the connecting the circuits can include connecting the first switches 352 to the power node 310 of FIG. 3A, connecting the first and second voltage controllers 322 and 326 to the first and second voltage sources 324 and 326, respectively, and/or connecting the first and second voltage controllers 322 and 326 to the power node 310. Also, connecting the circuits can include connecting the logic devices to the switches as described above.

Figure 8:
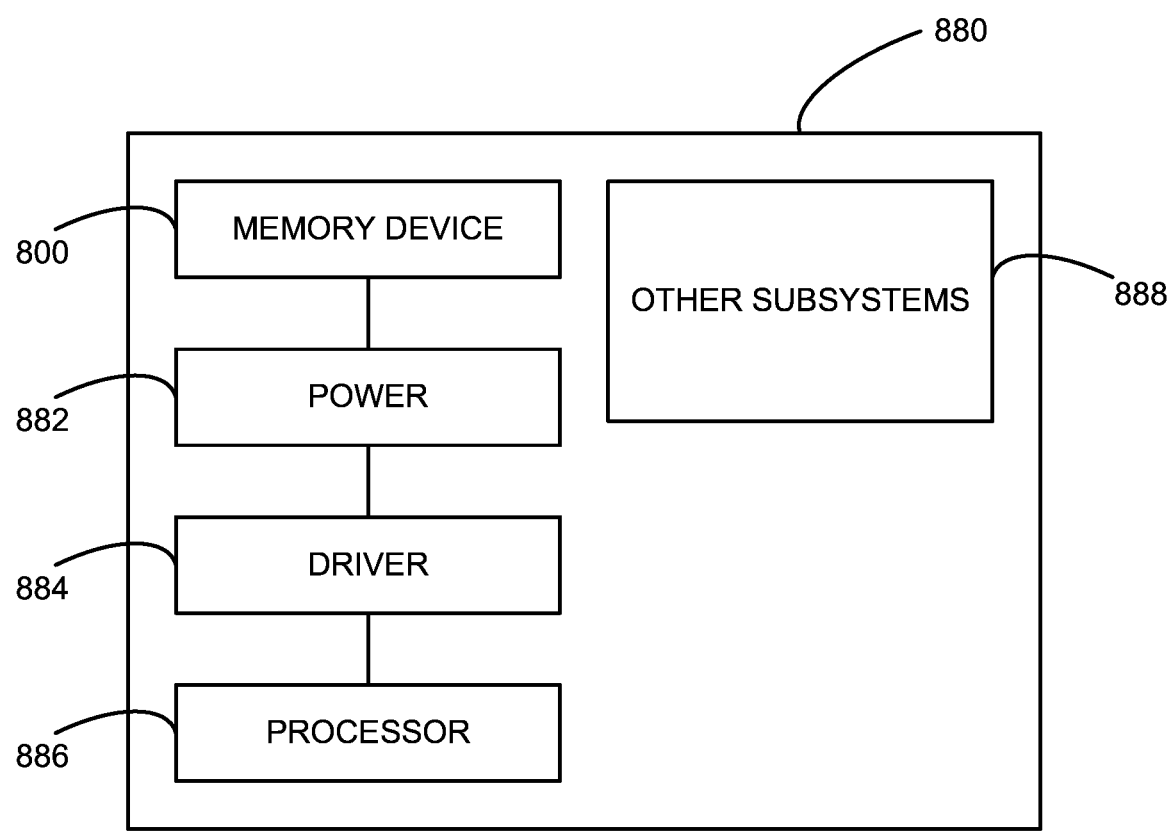
FIG. 8 is a schematic view of a system that includes an apparatus in accordance with an embodiment of the present technology.

FIG. 8 is a schematic view of a system that includes an apparatus in accordance with embodiments of the present technology. Any one of the foregoing apparatuses (e.g., memory devices) described above with reference to FIGS. 1-7B can be incorporated into any of a myriad of larger and/or more complex systems, a representative example of which is system 880 shown schematically in FIG. 8. The system 880 can include a memory device 800, a power source 882, a driver 884, a processor 886, and/or other subsystems or components 888. The memory device 800 can include features generally similar to those of the apparatus described above with reference to FIGS. 1-7B, and can therefore include various features for performing a direct read request from a host device. The resulting system 880 can perform any of a wide variety of functions, such as memory storage, data processing, and/or other suitable functions. Accordingly, representative systems 880 can include, without limitation, hand-held devices (e.g., mobile phones, tablets, digital readers, and digital audio players), computers, vehicles, appliances and other products. Components of the system 880 may be housed in a single unit or distributed over multiple, interconnected units (e.g., through a communications network). The components of the system 880 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of DRAM devices. Apparatuses configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structure includes information arranged as bits, words or code-words, blocks, files, input data, system-generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-8.

What is claimed is:

1. An apparatus, comprising:
   a retention circuit configured to locally store broadcasted information for access by an accessing circuit;
   a load circuit coupled to the retention circuit and configured to load the information into the retention circuit during a fuse broadcast phase; and
   a driving portion coupled to the retention circuit and configured to connect a first voltage and a second voltage to the retention circuit at different times for the load and the local storage, wherein the first and second voltages are different source voltages configured to provide power for loading the information into the retention circuit and/or for providing access to the stored information.

2. The apparatus of claim 1, wherein the driving portion is configured to connect to the retention circuit the first voltage during the fuse broadcast phase and the second voltage after the fuse broadcast phase.

3. The apparatus of claim 2, wherein the second voltage is greater than the first voltage.

4. The apparatus of claim 2, wherein the driving portion is configured to disconnect the retention circuit from both the first and the second voltages while the load circuit loads broadcast information or a portion thereof into the retention circuit.

5. The apparatus of claim 1, wherein:
   the retention circuit includes a set of cross-coupled inverters, wherein inputs of the inverters are connected to the load circuit and one or more components in the inverters are connected to a power node; and
   the driving portion connected to the power node and configured to control an operating state of the one or more components in the inverters based on controlling voltages supplied to the power node.

6. The apparatus of claim 5, wherein at least one inverter within the set of cross-coupled inverters includes a first switch and a second switch connected in series, wherein the first and second switches are complementary.

7. The apparatus of claim 6, wherein the first switch is a PMOS device with one or more terminals directly connected to the power node.

8. The apparatus of claim 1, wherein the driving portion includes:
   a first voltage controller connected between a first voltage source and the retention circuit, wherein the first voltage source corresponds to the first voltage; and
   a second voltage controller connected between a second voltage source and the retention circuit, wherein the second voltage source corresponds to the second voltage.

9. The apparatus of claim 8, wherein the first voltage controller is configured to connect the first voltage source to the retention circuit based on a fuse load signal and a load-done signal, wherein the fuse load signal corresponds to the fuse broadcast phase and the load-done signal corresponds to an end of the fuse broadcast phase.

10. The apparatus of claim 9, wherein the first voltage controller is configured to connect the first voltage source to the retention circuit before the end of the fuse broadcast phase and/or outside of a loading duration that corresponds to a duration for the load circuit to transfer broadcast information or a portion thereof into the retention circuit.

11. The apparatus of claim 8, wherein the second voltage controller is configured to connect the second voltage source to the retention circuit based on an inverted-done signal that corresponds to an end of the fuse broadcast phase.

12. The apparatus of claim 11, wherein the second voltage controller is configured to connect the second voltage source to the retention circuit at and/or after the end of the fuse broadcast phase.

13. The apparatus of claim 1, wherein:
   the retention circuit, the load circuit, and the driving portion comprise a first local latching circuit;
   further comprising:
   a second local latching circuit configured to load and provide access to separate information;
   a coupling circuit coupled to the first and second local latching circuits and configured to selectively connect load circuits of the first and second local latching circuits in parallel to each other; and
   an output selection circuit coupled to the first and second local latching circuits and configured to selectively provide access to the load circuits of the first and second local latching circuits.

14. The apparatus of claim 13, wherein:
   the coupling circuit is configured to connect the load circuits of the first and second local latching circuits (1) when one of the first and second local latching circuits is active and the other is inactive, wherein active latch is selected to store the information for access during operation, and (2) after the fuse broadcast; and
   the output selection circuit is configured to provide access to the load circuit of the active latch.

15. The apparatus of claim 1, wherein the retention circuit corresponds to a drive capacity and includes:
   a first storage portion corresponding to a portion of the drive capacity and located at a first location; and
   a second storage portion connected in parallel to the first storage portion, corresponding to a portion of the drive capacity, and located at a second location.

16. The apparatus of claim 1, wherein the retention circuit comprise a static random-access memory.

17. The apparatus of claim 16, wherein the apparatus comprises a dynamic random-access memory (DRAM) device.

18. A method of manufacturing an apparatus, the method comprising:
   providing retention circuit configured to locally store broadcasted information for access by an accessing circuit;
   connecting a load circuit to the retention circuit, wherein the load circuit is configured to transfer the information into the retention circuit during a fuse broadcast phase; and
   forming a driving circuit coupled to the retention circuit and configured to connect a first voltage and a second voltage to the retention circuit at different times for the load and the local storage, wherein the first and second voltages are different source voltages configured to provide power for loading the information into the retention circuit and/or for providing access to the stored information.

19. The method of claim 18, wherein:
   the retention circuit, the load circuit, and the driving circuit comprise a first local latching circuit;
   further comprising:
   forming a second local latching circuit configured to load and provide access to separate information;
   forming a coupling circuit coupled to the first and second local latching circuits and configured to selectively connect load circuits of the first and second local latching circuits in parallel to each other; and forming an output selection circuit coupled to the first and second local latching circuits and configured to selectively provide access to the load circuits of the first and second local latching circuits.

20. The method of claim 18, wherein the retention circuit corresponds to a drive capacity and includes:
a first storage portion corresponding to a portion of the drive capacity and located at a first location; and
a second storage portion connected in parallel to the first storage portion, corresponding to a portion of the drive capacity, and located at a second location.

* * * * *